(12) United States Patent
Ohshima

(10) Patent No.: US 7,504,849 B2
(45) Date of Patent: Mar. 17, 2009

(54) ON FAILURE DETECTING APPARATUS OF POWER SUPPLY CIRCUIT

(75) Inventor: Shunzou Ohshima, Kosai (JP)

(73) Assignee: Yazaki Corporation, Tokyo (JP)

( * ) Notice: Subject to any disclaimer, the term of this patent is extended or adjusted under 35 U.S.C. 154(b) by 205 days.

(21) Appl. No.: 11/640,216

(22) Filed: Dec. 18, 2006

(65) Prior Publication Data

US 2007/0139841 A1    Jun. 21, 2007

(30) Foreign Application Priority Data

Dec. 20, 2005  (JP) .............................. 2005-366416

(51) Int. Cl.
*G01R 31/26* (2006.01)

(52) U.S. Cl. ...................... 324/771; 324/769

(58) Field of Classification Search .................... None
See application file for complete search history.

(56) References Cited

U.S. PATENT DOCUMENTS 5,984,394 A * 11/1999 Bergeron ..................... 361/87

6,011,416 A * 1/2000 Mizuno et al. .............. 327/108
7,203,046 B2 * 4/2007 Ohshima ................... 361/93.1

FOREIGN PATENT DOCUMENTS

| JP | 6-017963 A | 1/1994 |
| JP | 8-270822 A | 10/1996 |
| JP | 11-326439 A | 11/1999 |

* cited by examiner

*Primary Examiner*—Vinh P Nguyen
(74) *Attorney, Agent, or Firm*—Sughrue Mion, PLLC

(57) ABSTRACT

An ON failure detecting apparatus detects an ON failure of an FET T1 of a power supply circuit which includes the FET T1 disposed between a battery E and a load RL, and controls driving and stopping of the load RL. The ON failure detecting apparatus includes a driver circuit 1 that supplies a driving voltage VD for switching ON and OFF of the FET T1 to a gate of the FET T1, a gate resistor Rg that is provided between the driver circuit 1 and a gate of the FET T1, and an ON failure determining circuit 11 that detects whether a voltage drop in the gate resistor Rg exceeds a predetermined value, and determines that an ON failure occurs in the FET T1, when the voltage drop in the gate resistor Rg exceeds the predetermined value.

5 Claims, 5 Drawing Sheets

ON FAILURE DETECTING APPARATUS OF POWER SUPPLY CIRCUIT

BACKGROUND OF THE INVENTION

1. Field of the Invention

The present invention relates to a power supply circuit in which a switching semiconductor element is provided between a power supply and a load, and more particularly, to an ON failure detecting apparatus that detects an ON failure of a semiconductor element.

2. Description of the Related Art

Generally, in a power supply circuit that includes a semiconductor element, such as a MOSFET or the like, disposed between a power supply and a load, and switches between ON and OFF of the semiconductor element so as to control ON and OFF of a power supply to the load, if an ON failure occurs in the semiconductor element, the semiconductor element enters a state where control is not possible, and thus it is not possible to stop a power supply to the load. At the same time, in a case in which an excess current protecting function assuming that the semiconductor element is normally intercepted is provided, the excess current protecting function is damaged. In this state, if failures such as short-circuiting and grounding of a wiring line at a downstream side of the semiconductor element happen simultaneously, they causes a problem in that the semiconductor element and the wiring line cannot be protected.

Accordingly, in order to prevent an ON failure of a semiconductor element of a power supply circuit in which a semiconductor element is disposed on a high side (power supply side) of a load, the following methods of (a) to (d) have been generally considered.

(a): A fuse is provided on an upstream side (power supply side) of a semiconductor element.

(b): Two semiconductor elements are connected in series to each other, and when there occurred an ON failure in one of the two semiconductor elements, a circuit is intercepted by using the other semiconductor element.

(c): The reliability of a semiconductor element and a control circuit are improved to be so reliable that an occurrence probability of an ON failure could be reduced.

(d): An ON failure detecting circuit and a back up circuit are prepared. When an ON failure occurs in a semiconductor element, failure information is output to the back up circuit, so that a power supply circuit is intercepted by the back up circuit.

However, among the above-described methods, the methods of (a) and (b) are not practical, because the number of components is increased, a space is increased, and the cost is increased. Further, as the method of (c), for example, a method disclosed in JP-A-2000-152691 (Patent Document 1) has been known. However, this method cannot provide a direct problem resolving means, and it is not possible to determine whether the method is sufficient for ON failure prevention. Finally, according to the method of (d), a monitoring and controlling function needs to be provided in the exterior and similar to the methods of (a) and (b), since the number of components is increased, an apparatus space is increased, and the cost is increased, the method of (d) is also not preferable.

Further, there is another method in which a fuse and a relay (contact-type switch) are assembled for high side switching. According to this method, even when an ON failure occurs in the relay, the fuse independently functions. Therefore, an excess current protecting function is not damaged, and there is no problem in terms of the reliability.

However, the switching structure including a fuse and a relay needs a large space for installation and generates a lot of heat emission. However, when the switching element is replaced by a semiconductor element, such as an FET to solve the space and heat problem, an ON failure of the FET becomes an obstacle. In replacing the switching element by the FET, an ON failure preventing means is essential, but an effective method does not exist in the present time, as described above.

As described above, in the power supply circuit where the semiconductor element, such as an FET, is used as a switching unit according to the related art, when an ON failure in the semiconductor occurs, there is no means to turn off the semiconductor so that a current through the semiconductor continues to flow with no controlling.

Accordingly, a new method is proposed to solve the ON failure problem, wherein once a phenomenon that leads to the ON failure is detected while the semiconductor has capability to turn itself off, the semiconductor can be shut down before it reaches to the ON failure.

SUMMARY OF THE INVENTION

Accordingly, the invention has been made to solve the above-described problems, and it is an object of the invention to provide an ON failure detecting apparatus for a power supply circuit which detects an indication of an ON failure of a semiconductor element used as a switching element for switching between ON and OFF of a power supply circuit, turns off the semiconductor element before an intercepting function of a circuit becomes disable, and protects the power supply circuit.

In order to achieve the above-mentioned object, according to an aspect of the invention, there is provided an ON failure detecting apparatus for a power supply circuit that detects an ON failure of a semiconductor element of the power supply circuit. The power supply circuit includes the semiconductor element disposed between a power supply and a load, and controlling driving and stopping of the load by switching ON and OFF of the semiconductor element. The ON-failure detecting apparatus includes a driving circuit that supplies a driving signal for switching ON and OFF of the semiconductor element to a driving terminal of the semiconductor element, a first resistor that are provided between the driving circuit and the driving terminal, and an ON failure determining unit that detects whether a voltage generated in the first resistor exceeds a predetermined value, and determines that an ON failure will occur in the semiconductor element, when the voltage exceeds the predetermined value.

Preferably, the ON failure detecting unit includes a comparing unit that compares a first voltage obtained by a voltage at one end of the first resistor and a second voltage obtained by a voltage at the other end of the first resistor, and detects whether a voltage generated in the first resistor exceeds a predetermined value on the basis of the result obtained by the comparing unit.

Preferably, the semiconductor element is composed of an N-type MOSFET, the power supply circuit is constructed such that a drain of the N-type MOSFET is connected to the power supply, and a source thereof is connected to the load, the driving circuit outputs a driving signal on the basis of a power supply voltage, and the ON failure determining unit detects whether a voltage generated in the first resistor exceeds a predetermined value on the basis of a gate voltage of the N-type MOSFET and the power supply voltage.

Preferably, the semiconductor element is composed of an N-type MOSFET, and the ON failure determining unit includes a grounding unit that stops, when it is determined that an ON failure will occur in the semiconductor element, the supply of a driving signal by the driving circuit, and connects a gate of the N-type MOSFET to a ground through a second resistor having a smaller resistance than the first resistor.

Preferably, the semiconductor element is composed of a P-type MOSFET, and the ON failure determining unit includes a shutting down unit that stops, when it is determined that an ON failure will occur in the semiconductor element, the supply of a driving signal by the driving circuit, and connects a gate of the P-type MOSFET to the power supply through a third resistor having a smaller resistance than the first resistor.

According to the aspect of the invention, in a case where the insulating layer is destructed in the semiconductor element and the leak current flows, the voltage drop that is generated due to the leak current flowing through the first resistor is measured. When the dropped voltage exceeds to the predetermined value, it is detected that a phenomenon that develops into the ON failure occurs in the semiconductor element. Therefore, it is possible to detect an indication that indicates a probability of the ON failure at the time point before the semiconductor element reaches the ON failure. Further, if the semiconductor element is turned off, while an intercepting capability exists in the semiconductor element, it is possible to surely protect the circuit.

According to the aspect of the invention, the ON failure detecting unit includes the comparing unit, and the comparing unit compares the voltages generated across the first resistor. When the voltage across the first resistor exceeds to the predetermined value, it is indicated that the ON failure will occur near future in the semiconductor element. This means that it is possible to detect the ON failure with high precision.

According to the aspect of the invention, when the semiconductor element is composed of an N-type MOSFET, it can be determined that the voltage generated in the first resistor exceeds the predetermined value on the basis of a voltage difference between the voltage of the power supply connected to the drain of the N-type MOSFET and the voltage at the gate of the N-type MOSFET. Therefore, it is possible to detect the ON failure with high precision. Further, when the driving circuit includes the charge pump, it is possible to detect whether the output voltage of the charge pump is abnormal.

According to the aspect of the invention, when it is detected by the ON failure determining unit that the ON failure will occur in the N-type MOSFET serving as the semiconductor element, the grounding unit can connect the gate of the N-type MOSFET to the ground through a second resistor having a smaller resistance than the first resistor connected to the gate. Therefore, it is possible to surely make the level of the gate of the N-type MOSFET approximate to the level of the ground. Further, it is possible to surely turn off the N-type MOSFET.

According to the aspect of the invention, when it is detected by the ON failure determining unit that the ON failure will occur in the P-type MOSFET serving as the semiconductor element, the shutting down unit can connect the gate of the P-type MOSFET to the power supply through a third resistor having a smaller resistance than the first resistor connected to the gate. Therefore, it is possible to surely make the voltage at the gate of the P-type MOSFET approximate to the power supply voltage. Further, the P-type MOSFET can be surely turned off.

DESCRIPTION OF THE PREFERRED EMBODIMENTS

Hereinafter, the preferred embodiments of the invention will be described in detail with reference to the accompanying drawings. First, in a general power supply circuit (circuit that does not include an ON failure detecting apparatus) that is used when driving loads, such as a lamp, a motor, and the like, mounted on a vehicle, a process in which an ON failure occurs in an FET for switching will be described.

Figure 1:
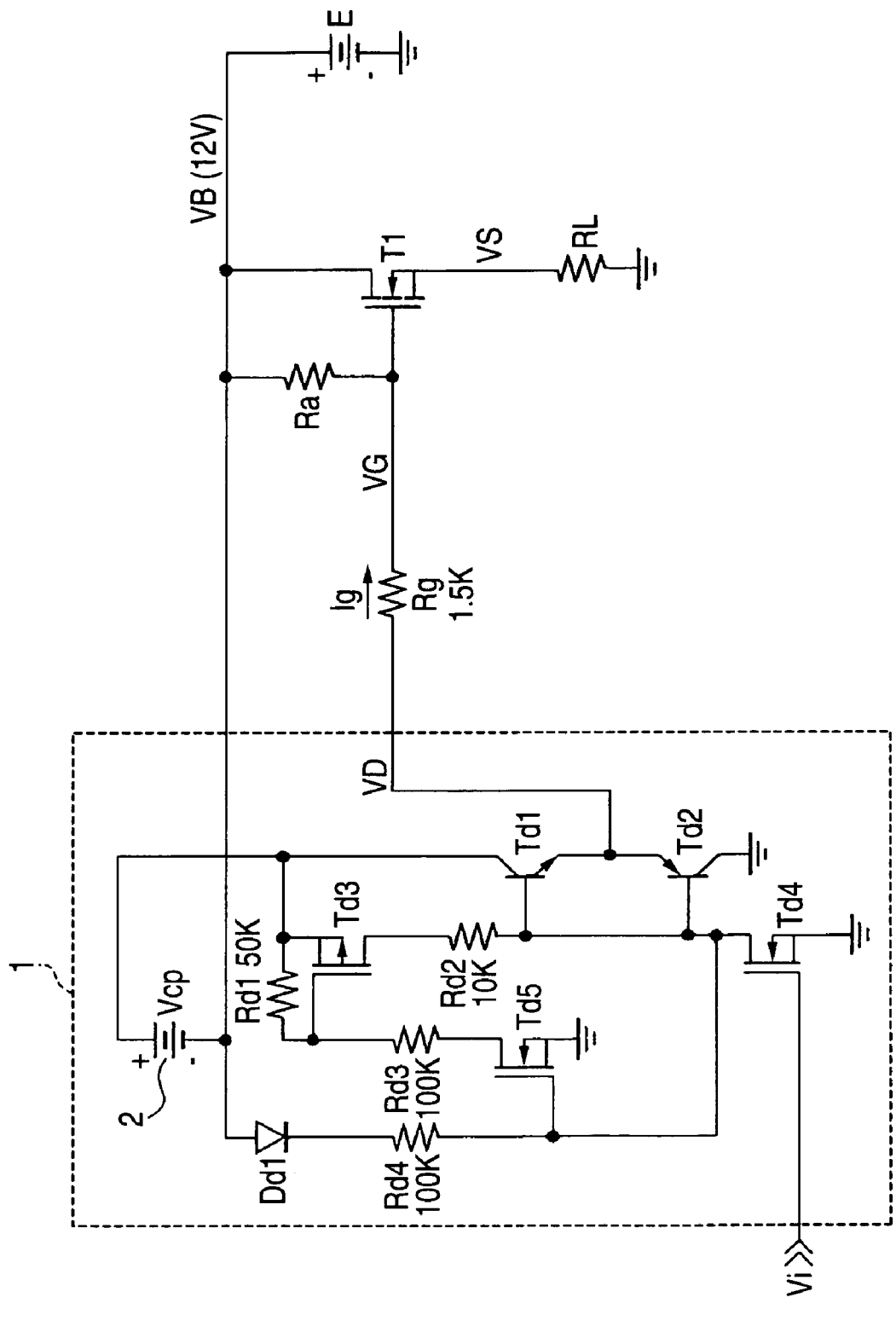
FIG. 1 is a circuit diagram illustrating a structure of a general power supply circuit that supplies a power supply voltage to a load so as to drive the load.

As shown in FIG. 1, a power supply circuit supplies driving power to a load RL. The power supply circuit includes a battery E (output voltage VB; for example, direct current voltage of 12 V) that serves as a power supply mounted on a vehicle, an N-type MOSFET T1 (hereinafter, simply referred to as 'FET') that is provided between a plus-side output terminal of the battery E and the load RL, and a driver circuit 1 (driving circuit) that outputs a driving signal to a gate (driving terminal) of the FET T1.

A drain of the FET T1 is connected to the plus-side terminal of the battery E and a source of the FET T1 is connected to one end of the load RL, and the other end of the load RL is connected to a ground. Further, the plus-side terminal of the battery E is connected to the driver circuit 1, such that driving power is supplied to the driver circuit 1.

The driver circuit 1 includes a charge pump 2 (output voltage Vcp; for example, direct current voltage of 10 V), transistors Td1 and Td2, FETs Td3 to Td5, resistors Rd1 to Rd4, and a diode Dd1. Further, each of numerical values that are displayed in the vicinity of reference numerals of the respective resistors Rd1 to Rd4 indicates a specific example of a resistance value. For example, it could be understood that a resistance value of the resistor Rd1 is set to 50 KΩ.

The specific configuration of the driver circuit 1 will be described below. A plus-side power line of the battery E is branched into two systems in the driver circuit 1. Then, one branched line is connected to a minus-side terminal of the charge pump 2, and the other branched line is connected to a drain of an FET Td4 (N type) through the diode Dd1 and a resistor Rd4. A source of the FET Td4 is connected to a ground. Further, a gate of the FET Td4 is supplied with a low-active input signal voltage Vi.

The plus-side terminal of the charge pump 2 is branched into two systems. One branched line is connected to a collector of a transistor Td1 (NPN type), an emitter of the transistor Td1 is connected to an emitter of a transistor Td2 (PNP type), and a collector of a transistor Td2 is connected to a ground. The other branched line is connected to a source of the FET Td3 (P type), and a drain of the FET Td3 is connected to a drain of the FET Td4 through the resistor Rd2.

The resistor Rd1 is provided between the gate and the source of the FET Td3. Further, a gate of the FET Td3 is connected to the drain of the FET Td5 (N type) through the resistor Rd3, and a source thereof is connected to a ground. Further, a gate of the FET Td5 is connected to the drain of the FET Td4.

Further, a base of each of the transistors Td1 and Td2 is connected in common to the drain of the FET Td4. Further, a driving signal output wiring line is connected to a connecting point between an emitter of the transistor Td1 and an emitter of the transistor Td2. The driving signal output wiring line is connected to a gate of the FET T1 through the gate resistor Rg (resistor).

Next, an operation of the power supply circuit shown in FIG. 1 will be described. The input signal voltage Vi functions as an active low voltage such that it turns on the FET T1 in an L level, and turns off the FET T1 in an H level. If the input signal voltage Vi becomes an L level, the FET Td4 is turned off, and the transistor Td2 is turned off. Further, the FETs Td5 and Td3, and the transistor Td1 are turned on. The voltage (VB+Vcp), which corresponds to a sum between a voltage VB of the battery E and an output voltage Vcp of the charge pump 2 that is set to about 10 V, becomes an output voltage VD of the driver circuit 1. The output voltage VD is supplied to the gate of the FET T1 through the gate resistor Rg. As a result, the FET T1 is turned on, and power is supplied to the load RL from the battery E, so that the load RL is driven.

Further, if the input signal voltage Vi becomes a high level, the FET Td4 and the transistor Td2 are turned on, and the FETs Td5 and Td3, and the transistor Td1 are turned off. As a result, the gate of the FET T1 is connected to a ground through the gate resistor Rg and the transistor Td2. Therefore, the FET T1 is tuned off, and power supply for the load RL is intercepted.

In this case, as one of factors that cause a failure in the FET T1 for driving the load RL, there is destruction of a gate insulating layer that generates a leak current. The reason why the gate insulting layer is destructed is because the gate insulating layer is extraordinarily thin. It is assumed that destruction of the gate insulating layer is the main reason why there occurs a failure in the FET T1. If the insulating layer is destructed, a current leaks between a gate and a drain, or between a gate and a source. Of them, if the leak current is generated between the gate and the source, a short circuit occurs between the gate and the source, and thus a failure occurs in the FET T1. At this time, the FET T1 is turned off, and performs a fail safe operation. Accordingly, there is little problem in terms of safety.

Meanwhile, since the leak current generated between the gate and the drain causes an ON failure in the FET, the FET cannot perform a fail safe operation, and thus trouble may occur.

Generally, the FET that is used for power control has a structure in which a plurality of FETs becoming elements (hereinafter, referred to as 'element FETs') are connected parallel to one another, and the number of the element FETs is in a range of several hundreds of thousands to several millions. Accordingly, it is assumed that even when the destruction of the insulating layers occurs, the insulating layers are not simultaneously destructed between the gates and the drains of the entire element FETs, an insulation layer of a portion of the element FETs starts to be destructed, and the other insulating layers of the other portion of the element FETs are gradually destructed, which causes the ON failure in the FET.

From the above description, in a circuit shown in FIG. 1, it is assumed that a process reaching the ON failure after an insulating layer is destructed between the gate and the drain is as illustrated in the following (a) to (c).

(a): When the FET T1 is turned on, if an insulating layer is destructed between the gate and the drain of a portion of the element FETs due to any reason, the gate and the drain are electrically connected through the element FET whose insulating layer is destructed. If the leak resistance between the gate and the drain designates Ra (a resistor Ra shown in FIG. 1 equivalently shows the leak resistance), a value of Ra whose value is infinite in a normal state is reduced due to the destruction of the insulating layer, and becomes a finite value. However, the leak resistance Ra depends on the extent of the destruction of the insulating layer and a range in which the insulating layer is destructed. In most of cases, if compared with the gate resistance Rg (1 to 2 KΩ), it is considered that the leak resistance Ra is maintained as a sufficiently large resistance value at an initial stage.

In a normal state, the output voltage VD of the driver circuit 1 becomes equal to the gate voltage VG of the FET T1. However, if the insulating layer is destructed and the leak resistance Ra becomes a finite value, a leak current Ig flows through the drain from the gate through the leak resistor Ra. In addition, if the leak current Ig flows, a voltage drop is generated in the gate resistor Rg, and the gate voltage VG becomes smaller than the output voltage VD of the driver circuit 1. At this time, the gate voltage VG is represented by Equation 1.

$$VG=VD-Rg*IG \qquad \text{Equation 1}$$

Further, if the range in which an insulating layer is destructed is increased, the leak resistance Ra is decreased, and the leak current Ig is increased. The reduction of the gate voltage VG is increased. Accordingly, by detecting the leak current Ig or a voltage drop in the gate resistor Rg, it is possible to know the extent of the destruction of the insulating layer that occurs in the FET T1. Generally, the threshold voltage Vth of the FET T1 is 4 V or less. Therefore, if the condition VG>VB+4V is satisfied, even though an insulating layer is destructed in a portion of the element FETs, ON-resistance of the FET T1 is maintained to an approximate normal value. An amount of heat emitted from the FET T1 is not increased, and the thermal destruction of the FET T1 does not rapidly progress.

(b): When the FET T1 is turned off, in a normal case where the insulating layer is not destructed, a terminal of the gate voltage VG is connected to a ground through the transistor Td2 that is provided in the driver circuit 1, and the gate voltage VG decreases to about 0.6 V and becomes smaller than the threshold voltage Vth of the FET T1. As a result, the FET T1 is intercepted. Meanwhile, when the FET T1 is in the state of (a), that is, when an insulting layer is destructed in the FET T1, an input signal voltage Vi that is supplied to the driver circuit 1 becomes an H level. At this time, even when the transistor Td2 is turned on, the gate voltage VG of the FET T1 is not decreased to 0.6 V. When the leak resistance Ra is small, the gate voltage VG may be increased, and thus the FET T1 is not turned off. That is, an ON failure occurs.

At this time, the gate voltage VG is represented by Equation 2.

$$VG=VB*Rg/(Ra+Rg) \qquad \text{Equation 2}$$

Further, in Equation 2, a voltage drop between an emitter and a base of the transistor Td2 is ignored.

If the gate voltage VG becomes larger than the threshold value Vth of the FET T1, even when the input signal voltage Vi supplied to the driver circuit 1 becomes a high level, the FET T1 is not turned off. In this case, if calculating a leak resistance Ra when the gate voltage VG becomes equal to the threshold voltage Vth, it is represented by Equation 3.

$$VG=VB*Rg/(Ra+Rg)=Vth$$

$$Ra=Rg(VB-Vth)/Vth \qquad \text{Equation 3}$$

In addition, from Equation 3, a condition where the FET T1 is not turned off when the input signal voltage Vi becomes an H level is represented by Equation 3'.

$$Ra \leq Rg(VB-Vth)/Vth \qquad \text{Equation 3'}$$

In the common N-type MOSFET, the threshold voltage Vth is in a range of 2 to 4 V. Accordingly, in Equation 3', as the gate resistance Rg is increased, the voltage VB of the battery E is increased, and the threshold voltage Vth is decreased, even though the leak resistance Ra is increased, the FET T1 is not turned off.

Further, if the condition VG>Vth is satisfied, the FET T1 operates as a source follower. If the drain current is set to ID (current flowing through a load RL), the condition VG−Vth=RL*ID is satisfied, and thus the voltage VDS between the drain and the source is represented by Equation 4.

$$VDS=VB-(VG-Vth)=VB-RL*ID \qquad \text{Equation 4}$$

At this time, if power loss occurring in the FET T1 is referred to as P[W], the power loss P is represented by Equation 5.

$$\begin{aligned} P &= VDS*ID \\ &= \{VB-(VG-Vth)\}*ID \\ &= \{VB-(VG-Vth)\}*(VG-Vth)/RL \end{aligned} \qquad \text{Equation 5}$$

Figure 2:
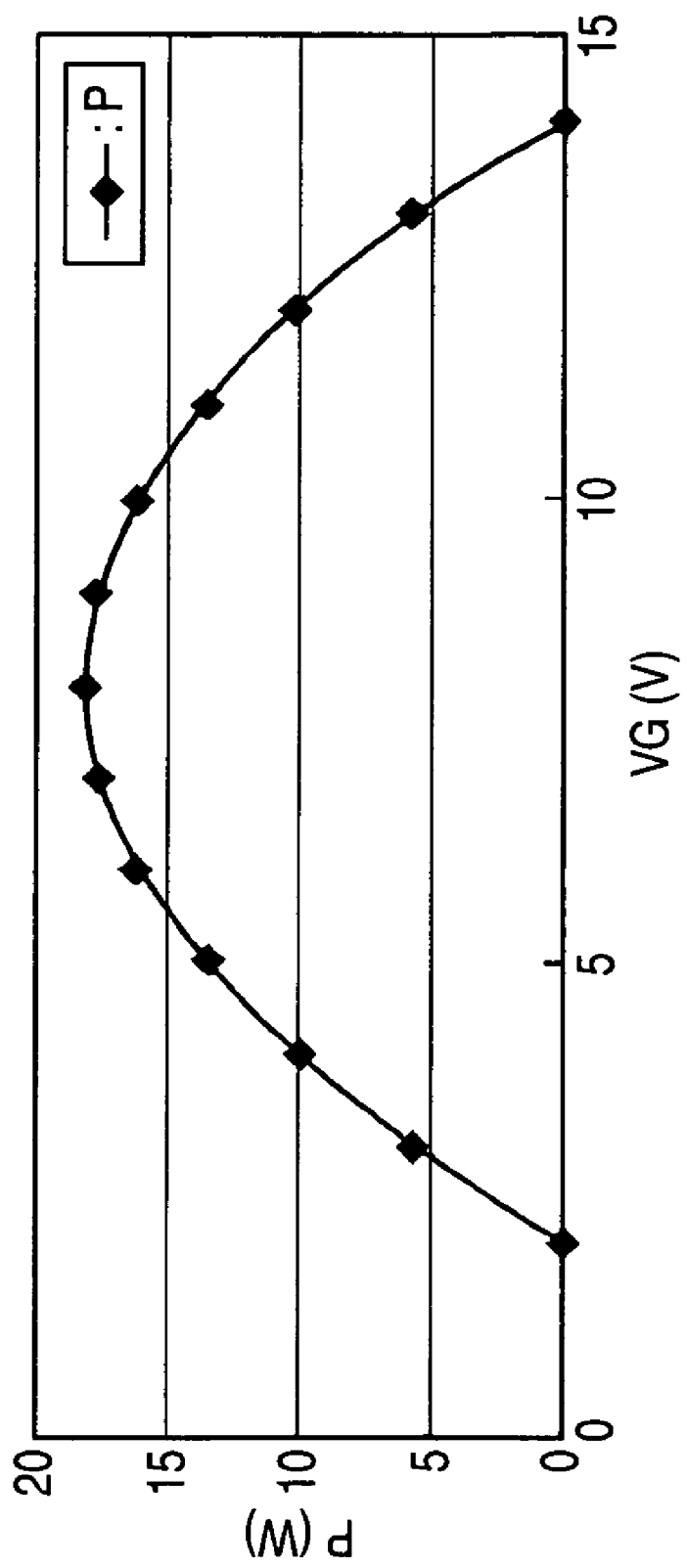
FIG. 2 is a characteristic view illustrating the relationship between a gate voltage of an FET T1 for switching and power loss.

In this case, as an example, in a state where the VB is set to 12 V, Vth is set to 2 V, and RL is set to 2Ω, if power loss P of the FET T1 with respect to the gate voltage VG is represented by a graph, it is represented by a graph shown in FIG. 2.

As can understood from the graph shown in FIG. 2, if the gate voltage VG exceeds the Vth=2 V, the power loss starts to be generated, and becomes a maximum when the VG is 8 V. As a specific example, when it is assumed that VG is 4 V, power loss of 10 W is generated. In addition, if the thermal resistance to the air from the channel of the FET T1 is set to 20° C./W, the temperature increases by 200° C. When the gate resistance Rg is 1.5 KΩ, the leak resistance Ra that becomes VG=4 V becomes 3 KΩ by Equation 2. It appears that a drain current begins to flow through the FET T1 even if the leak resistance Ra is considerably high while the FET T1 is in the off state.

The heat emission caused by power consumption in FET which is in the off state is contributed by not only the element FET whose insulating layer is destructed but also a normal element FET. If the drain current starts to flow, even when it is a small amount of current, since the voltage VDS is large, it causes large power loss. At an intermediate stage where the FET T1 is shifted from an off state to an on state, large power loss is generated. When the VDS is VB/2, maximum power loss is generated. It indicates there is a high possibility that the FET T1 is burned before it reaches the ON failure. Specifically, after the drain current starts to flow due to the partial destruction of the insulating layer, the maximum power loss is generated at the middle zone of the source voltage of the FET T1 when it traverses from the ground level to the supply voltage level where the FET would reach to the on-failure state. If a time interval in which the source voltage of the FET stays at the this middle zone between the ground level to the supply voltage level is prolonged, the FET T1 may be burned before it reaches the ON failure.

If the drain current starts to flow through the FET T1 in an off state, heat emission is generated due to the power loss. As a result, a destructing range of an insulating layer of the element FET is increased or the normal element FET is destructed due to the heat.

(c): In the state of (b), when turning on the FET T1 from an off state in a situation that the leak resistance Ra becomes smaller, the voltage drop VD−VG across the gate resistor Rg is increased, and the voltage drop VG−VB approaches toward Vth. As a result, since the voltage between the gate and the source of the FET T1 decreases, a voltage VDSon between the drain and the source of the FET T1 increases at the time of turning on the FET T1, and the heat emission of the FET T1 during on-state is rapidly increased. In a case where the VDSon is set to 50 mV and the Vth is set to 2 V in the normal state, if the VG becomes VB, the VDSon becomes substantially equal to the Vth. As compared with a normal state, the power loss becomes forty times larger than that in the normal state deduced from the relationship 2 V/50 mV=40. If this state is maintained, the FET T1 is destructed due to the heat emission, and it becomes a state where control is not possible, that is, a state where interception is not possible, which leads to an ON failure state.

Focusing on the above description, if a portion of the element FETs causes the destruction of the insulating layer between the gate and the drain, the leak current is generated at the time of turning off the FET T1, and the heat emission is generated. If the FET T1 starts to be destructed due to the heat at the time of being turned off, the voltage between the gate and the source of the FET T1 is decreased at the time of turning on the FET T1, and the heat emission of the FET T1 is increased at the time of turning on the FET T1. A heat emitting mechanism at the time of turning off the FET T1 is different from that at the time of turning on the FET T1. In the other word, the heat emission at the time of turning off the FET T1 dominates in the early stage in which the insulating layer starts to be destructed, and the heat emission at the time of turning on the FET T1 dominates in the later stage in which the destruction of the insulating layer progresses. The two heat emission mechanisms interact with each other. Finally, it is assumed that the insulating layer is destructed due to the heat, and an ON failure occurs in the FET T1.

Accordingly, on the basis of the contents described in (a) to (c), methods of (1) and (2) described below are adopted in the invention.

(1): As the insulating layer destruction occurs between the gate and the drain of a portion of the element FETs, in the process causing the destruction of the FET T1 due to the heat, the leak resistance Ra is decreased, the decrease in the leak resistance Ra causes increase in the leak current Ig flowing through the gate resistor Rg, which increases the voltage drop in the gate resistor Rg. Accordingly, if measuring the voltage drop in the gate resister Rg when the FET T1 is turned on, it is possible to detect an ON failure occurring due to the destruction of the insulating layer in advance. That is, at a stage before reaching a complete ON failure, it is possible to detect the indication that the ON failure occurs. At this time, the detection sensitivity is improved as the gate resistance Rg is increased.

(2): If the phenomenon reaching the ON failure is detected according to the sequence illustrated in (1), the FET T1 is intercepted. In order to intercept the FET T1, when the driver circuit 1 is connected to a ground, the condition VG<Vth should be made to be satisfied. It may be easily achieved, if the resistance between the gate of the FET T1 and the ground is small. That is, a circuit is constructed such that the resistance between the gate and the ground at the time of turning off the FET T1 becomes smaller than the gate resistance Rg.

Figure 3:
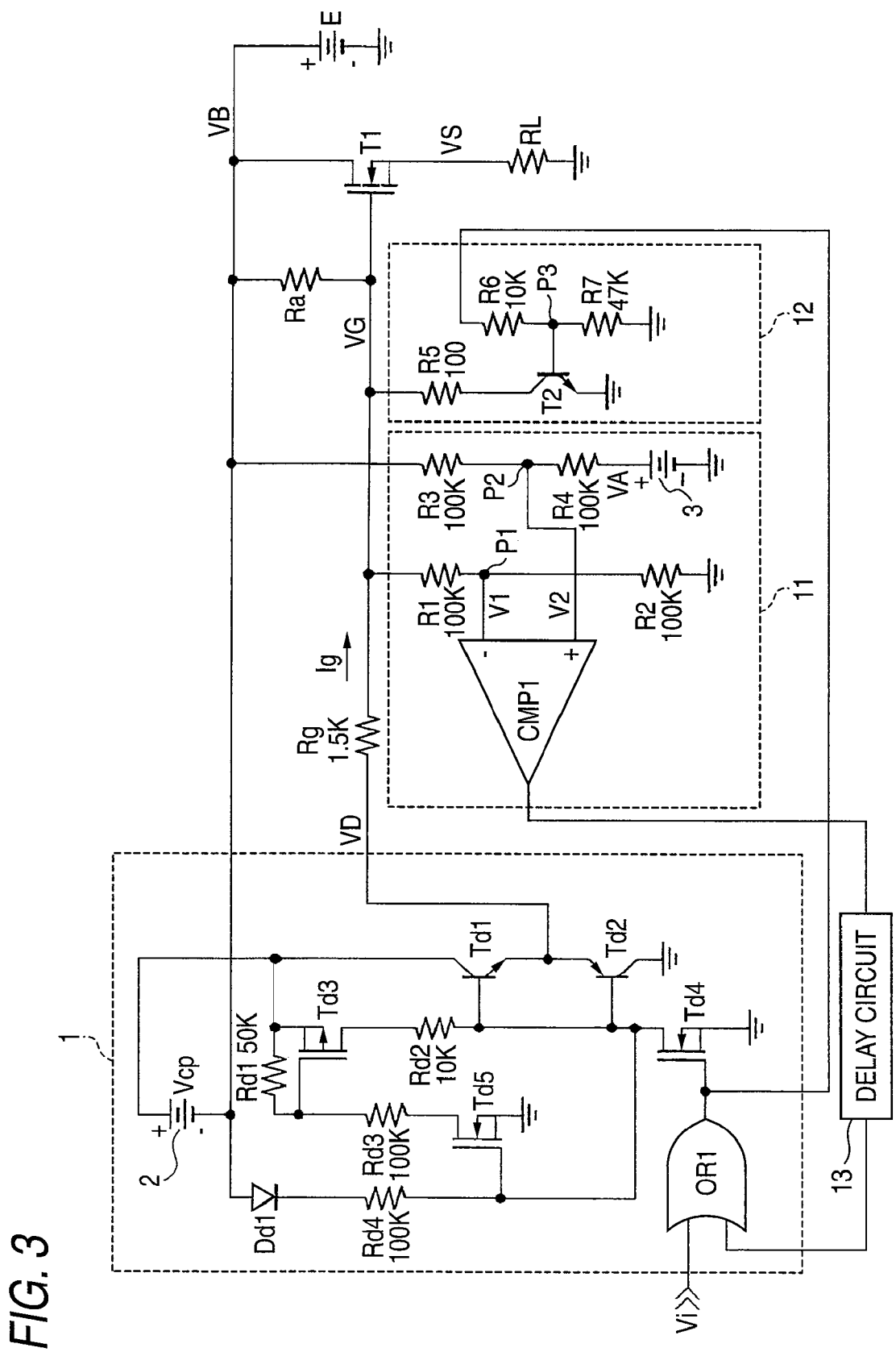
FIG. 3 is a circuit diagram illustrating a structure of an ON failure detecting apparatus for a power supply circuit according to a first embodiment of the invention.

Hereinafter, the embodiment of the invention that has the above-described structure will be described. FIG. 3 is a circuit diagram illustrating a structure of an ON failure detecting apparatus for a power supply circuit according to the first embodiment of the invention. In FIG. 3, the same constituent elements as those of the power supply circuit shown in FIG. 1 are denoted by the same reference numerals, and the description thereof will be omitted.

The power supply circuit shown in FIG. 3 is different from the power supply circuit shown in FIG. 1 in that it includes an ON failure determining circuit 11 (ON failure determining unit), a gate grounding circuit 12 (grounding unit), and a filter circuit 13, and the driver circuit 1 includes an OR circuit OR1.

The ON failure determining circuit 11 includes a series connecting circuit of resistors R1 and R2 that are provided between the gate of the FET T1 and the ground, and a series connecting circuit of resistors R3 and R4 and a direct current power supply 3 (output voltage VA) that are provided between the plus-side terminal (voltage VB) of the battery E and the ground. The ON failure determining circuit 11 further includes a comparator CMP1 (comparing unit). The connecting point P1 between the resistors R1 and R2 is connected to an inverting input terminal of the comparator CMP1, and the connecting point P2 between the resistors R3 and R4 is connected to the non-inverting input terminal of the comparator CMP1.

Further, the output terminal of the comparator CMP1 is connected to the filter circuit 13. The output terminal of the filter circuit 13 is connected to one input terminal of the OR circuit OR1 provided in the driver circuit 1, and the other input terminal of the OR circuit OR1 is applied with the input signal voltage Vi. The filter circuit 13 functions at starting time in such a way that the filter circuit outputs an L level as long as the comparator CMP1 outputs an H level during a transient period after an input signal Vi turns from an H level to an L level. Each of the values that are displayed in the vicinity of the respective resistors R1 to R7 of FIG. 3 shows a specific example of a resistance value of each of the resistors R1 to R7. For example, the resistance value of the resistor R1 is set to 100 KΩ.

The gate grounding circuit 12 includes a transistor T2 (NPN type) for connecting the gate of the FET T1 to a ground, a resistor R5 that is provided between a collector of the transistor T2 and the gate of the FET T1, and a series connecting circuit of resistors R6 and R7 that are provided between the output terminal of the OR circuit OR1 and the ground. The connecting point P3 between the resistors R6 and R7 is connected to a base of the transistor T2. Further, the resistance value of the resistor R5 is, for example, 100Ω. The resistor R5 is set such that it has a smaller resistance value than the gate resistor Rg having a resistance value of, for example, 1.5 KΩ.

Next, the function of the ON failure detecting apparatus according to the embodiment of the invention that has the above-described structure will be described. In this case, the resistance values of the respective resistors R1 to R4 are selected to satisfy the conditions R1=R2 and R3=R4. Further, the voltages of the inverting input terminal (point P1) and the non-inverting input terminal (point P2) of the comparator CMP1 are respectively set to V1 and V2, and the output voltage (referred to as 'reference voltage') of the direct current power supply 3 is set to VA.

If setting the conditions R2/(R1+R2)=R4/(R3+R4)=a (a indicates a voltage dividing ratio) and VG−VB=δ, Equation 6 is obtained.

$$V1 = VG^* a = (VB+\delta)a$$

$$V2 = (VB-VA)a + VA \qquad \text{Equation 6}$$

From Equation 6, if calculating δ when the condition V1=V2 is satisfied, it is represented by Equation 7.

$$(VB+\delta)a = (VB-VA)a + VA$$

$$\delta = VA^*(1-a)/a \qquad \text{Equation 7}$$

From Equation 7, when the condition V1=V2 is satisfied, that is, when the output of the comparator CMP1 is inverted, δ corresponding to this condition can be set to any value by adjusting the reference voltage VA and the voltage dividing ratio a. For example, if the conditions VA=4 V and a=0.5 are set, δ becomes 4 V. That is, if the condition VG>(VB+4 V) is satisfied, the output of the comparator CMP1 becomes an L level, and if the condition VG<(VB+4 V) is satisfied, the output of the comparator CMP1 becomes an H level.

Meanwhile, when the FET T1 is turned on, since the output voltage VD of the driver circuit 1 becomes VB+Vcp, Rg*Ig that corresponds to a voltage dropped in the gate resistor Rg is represented by Equation 8.

$$Rg^*Ig = VD - VG = (VB+Vcp) - (VB+\delta) = Vcp - \delta \qquad \text{Equation 8}$$

Therefore, when Vcp is 10 V and δ is 4 V, that is, when a voltage drop of 6 V or more is generated in the gate resistance Rg, the output level of the comparator CMP1 becomes an H level. If the output level of the comparator CMP1 becomes an H level and this state is maintained for a predetermined time, it is determined that the insulating layer destruction occurs between the gate and the drain, and the output level of the OR circuit OR1 is allowed to become an H level. That is, if the output signal of the comparator CMP1 becomes an H level, a signal of an H level is input to one input terminal of the OR circuit OR1 of the driver circuit 1 via the filter circuit 13 after the predetermined time elapses, and thus the output signal of the OR circuit OR1 becomes an H level. As a result, the output terminal of the driver circuit 1 is connected to a ground through the transistor Td2, and at the same time, the transistor T2 is turned on, and the gate of the FET T1 is grounded by the parallel synthesizing resistance (represented by 'Rg∥R5') which consists of the gate resistance Rg and the resistance R5.

At this time, the gate voltage VG is represented by Equation 9.

$$VG = VB^*(Rg\|R5)/\{(Rg\|R5)+Ra\} \qquad \text{Equation 9}$$

In this case, as compared with the case in which the resistor R5 is not provided, the gate voltage VG with respect to the same leak resistor Ra is decreased, which easily satisfies the condition VG<Vth.

If the gate resistance Rg is increased, the detection of the leak current Ig flowing from the gate to the drain becomes easier, and if the resistance R5 is decreased, the FET T1 can be intercepted even though the leak resistance Ra becomes smaller. As such, the resistance values of the gate resistor Rg and the resistor R5 are so selected comprehensively, that the destruction of the insulating layer between the gate and the drain (partial destruction of the insulating layer of the element FET) is detected, and that the FET T1 can be intercepted at the time point when the FET T1 has an intercepting capability. Consequently, the FET T1 can be prevented from reaching the ON failure.

In this way, in the ON failure detecting apparatus according to the first embodiment of the invention, the destruction of the insulating layer occurs in the FET T1, the leak current increases, the voltage V1 at the connecting point P1 is decreased, and the voltage V2 at the connecting point P2 is unchanged. In this case, the output terminal of the driver circuit 1 is connected to the ground, and the driving signal supply to the FET T1 is stopped. Therefore, the FET T1 is turned off before an ON failure occurs in the FET T1, and the FET T1, the load, and a circuit constituent component, such as an electrical wiring line, can be protected.

Further, at the same time when the output terminal of the driver circuit 1 is connected to a ground, the transistor T2 of the gate grounding circuit 12 is turned on, and the gate of the FET T1 is connected to a ground through the resistor R5 (R5<Rg). Therefore, it is possible to surely make the gate voltage VG smaller than the threshold voltage Vth, and thus to surely turn off the FET T1.

Further, in the first embodiment, the voltage drop of the charge pump 2 that is provided in the driver circuit 1 results in giving the same effect to the voltage V1 at the point 1 as that of a reduced Ra. That is, even in a state where the leak resistance Ra is infinitely large (in a state where the destruction of the insulating layer does not occur), when the output voltage of the charge pump 2 is decreased, the voltage V1 at the connecting point P1 may be smaller than the voltage V2 at the connecting point P2, and the FET T1 is turned off. Accordingly, it is possible to detect that the output voltage of the charge pump 2 is abnormal.

Figure 4:
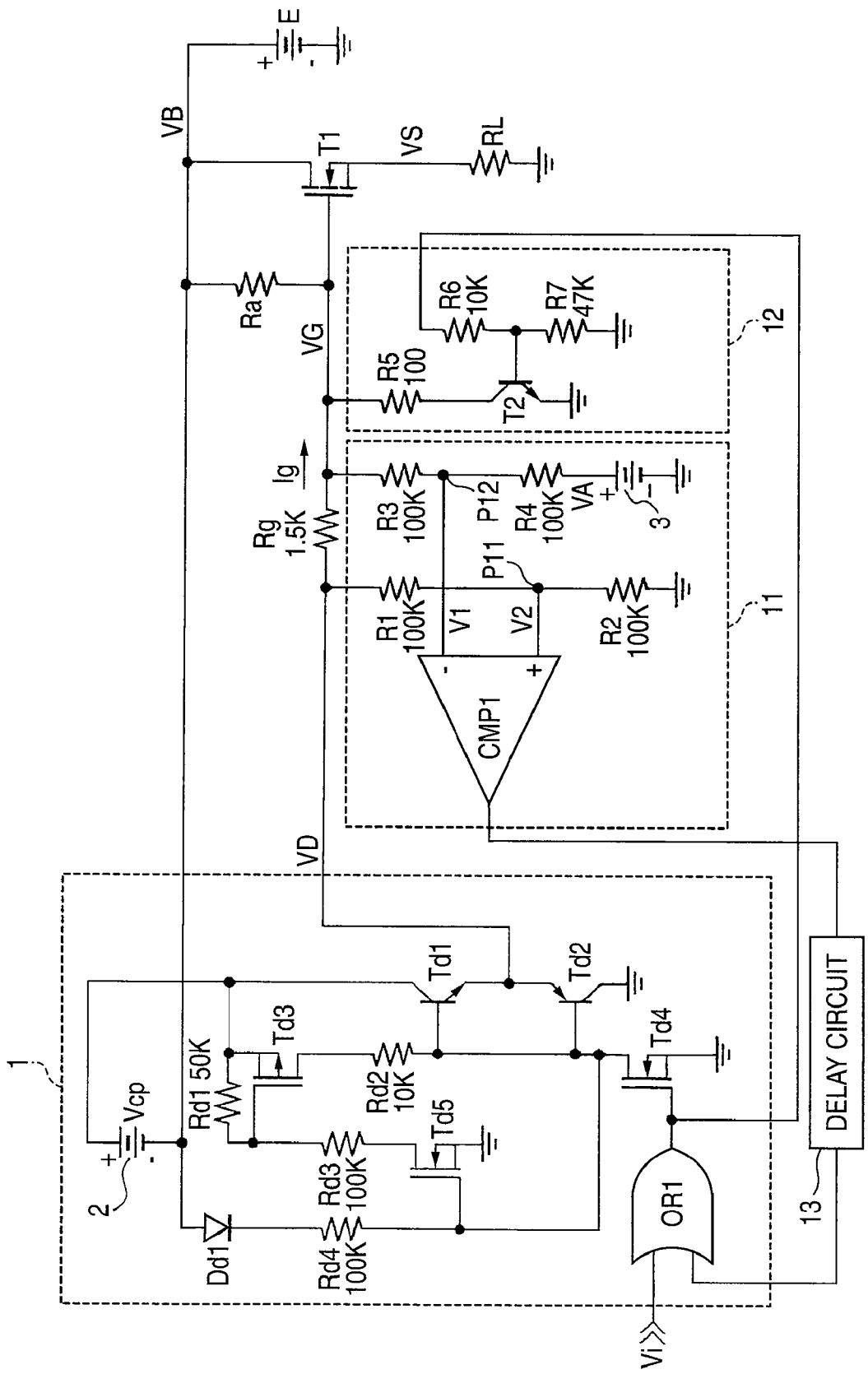
FIG. 4 is a circuit diagram illustrating a structure of an ON failure detecting apparatus for a power supply circuit according to a second embodiment of the invention.

Next, a second embodiment of the invention will be described. FIG. 4 is a circuit diagram illustrating a structure of an ON failure detecting apparatus for a power supply circuit according to the second embodiment of the invention. Since the second embodiment shown in FIG. 4 is different from the first embodiment shown in FIG. 3 in only a structure of the ON failure determining circuit 11 (ON failure determining unit), the difference between the first embodiment and the second embodiment in the structures will be described.

The ON failure determining circuit 11 shown in FIG. 4 includes a series connecting circuit of resistors R1 and R2 that are provided between a terminal of the gate resistor Rg of the FET T1 on the side of the driver circuit 1 and the ground, and a series connecting circuit of resistors R3 and R4 and a direct current power supply 3 that are provided between a terminal of the gate resistor Rg on the side of the FET T1 and the ground. In addition, the connecting point P11 (voltage V1; first voltage) between the resistors R1 and R2 is connected to the non-inverting input terminal of the comparator CMP1, and a connecting point P12 (voltage V2; second voltage) between the resistors R3 and R4 is connected to the inverting input terminal of the comparator CMP1.

In addition, in a state where the reference voltage VA output by the direct current power supply 3 is set to 6 V, if the voltage drop in the gate resistor Rg becomes 6 V or more in the ON failure determining circuit, the output signal of the comparator CMP1 is inverted from an L level to an H level, the transistor Td2 provided in the driver circuit 1 and the transistor T2 of the gate grounding circuit 12 are turned on, and the gate of the FET T1 is connected to a ground through a parallel circuit which consists of the gate resistor Rg and the resistor R5. That is, in the second embodiment shown in FIG. 4, in a case where the voltage drop in the gate resistor Rg is directly measured, and the measured voltage becomes a predetermined level and then is maintained for a predetermined time, it is determined that the destruction of the insulating layer occurs between the gate and the source of the FET T1, and the gate is connected to ground, which intercepts the FET T1.

As such, in the ON failure detecting apparatus of the power supply circuit according to the second embodiment of the invention, it is determined on the basis of the voltage drop in the gate resistor Rg that the insulating layer is destructed between the gate and the drain of the FET T1. In this case, when it is determined that the insulating layer is destructed, the FET T1 is turned off. Therefore, it is possible to prevent the ON failure from occurring due to the destruction of the insulating layer.

Further, since the occurrence of the leak current is detected on the basis of the voltages across the gate resistor Rg, as compared with the first embodiment, only the destruction of the insulating layer in the FET T1 can be detected regardless of the decrease in the output voltage of the charge pump 2.

Figure 5:
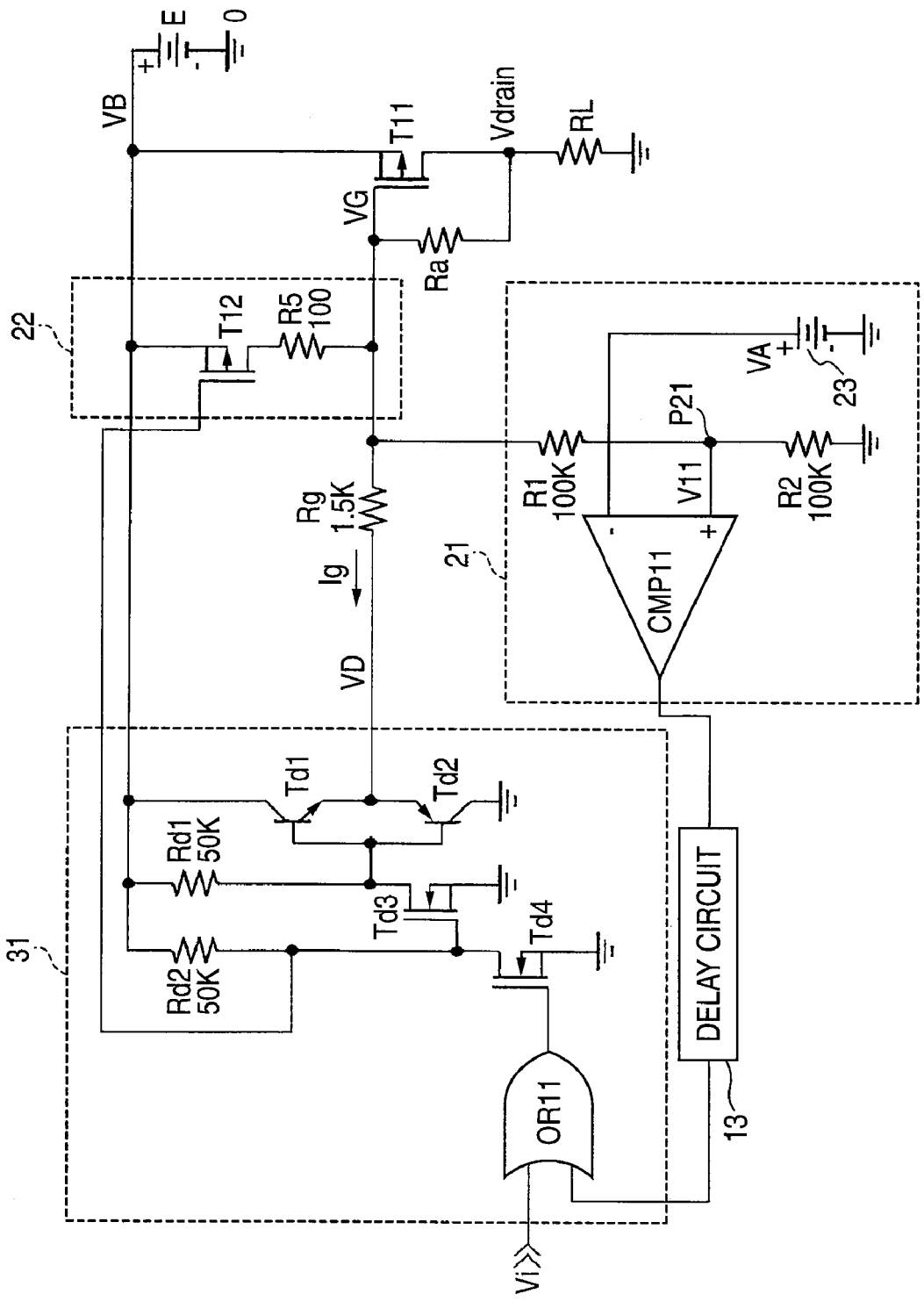
FIG. 5 is a circuit diagram illustrating a structure of an ON failure detecting apparatus for a power supply circuit according to a third embodiment of the invention.

Next, a third embodiment of the invention will be described. FIG. 5 is a circuit diagram illustrating a structure of an ON failure detecting apparatus for a power supply circuit according to the third embodiment of the invention.

In the first and second embodiments, as a semiconductor element for switching the driving and stopping of the load RL, the N-type MOSFET T1 has been used. However, in the third embodiment, a P-type MOSFET T11 is used. That is, the third embodiment is different from the first and second embodiments in that the P-type MOSFET T11 and a different circuit structure according to the modification in the type of the MOSFET are used.

Hereinafter, a specific circuit structure will be described. In the P-type MOSFET (hereinafter, simply referred to as 'FET') that functions as a semiconductor element provided between the battery E and the load RL, a source thereof is connected to a plus-side terminal of the battery E, and a drain is connected to one end of the load RL.

Further, the power supply circuit according to the third embodiment of the invention includes a driver circuit 31 that outputs a driving signal to the gate of the FET T11, an ON failure determining circuit 21, a shutting down circuit 22 (shutting down unit), and a filter circuit 13.

The driver circuit 31 includes resistors Rd1 and Rd2, FETs Td3 and Td4 (N type), a transistor Td1 (NPN type), a transistor Td2 (PNP type), and an OR circuit OR11. As a specific structure, a power line of the battery E that is connected to the driver circuit 31 is branched in three systems. One branched power line is connected to a ground through the resistor Rd2 and the FET Td4, another branched power line is connected to a ground through the resistor Rd1 and the FET Td3, and the other branched power line is connected to a ground through the transistors Td1 and Td2.

A gate of each of the two transistors Td1 and Td2 is connected to a drain of the FET Td3, and a gate of the FET Td3 is connected to a drain of the FET Td4. In addition, a connecting point between the emitter of the transistor Td1 and the emitter of the transistor Td2 is connected to a wiring line for outputting an output voltage VD of the driver circuit 31.

A gate of the FET Td4 is connected to an output terminal of the OR circuit OR11. One input terminal of the OR circuit OR11 is connected to the output terminal of the filter circuit 13, and the other input terminal is supplied with an input signal voltage Vi.

The ON failure determining circuit 21 includes a series connecting circuit composed of resistors R1 and R2 that are provided between the gate of the FET T11 and the ground, a comparator CMP11 (comparing unit), and a direct current power supply 23 (output voltage VA). In addition, a connecting point P21 (voltage V11) between the resistors R1 and R2 is connected to the non-inverting input terminal of the comparator CMP11, and a plus-side output terminal of the direct current power supply 23 is connected to the inverting input terminal. Further, the output terminal of the comparator CMP11 is connected to the filter circuit 13.

The shutting down circuit 22 includes a series connecting circuit composed of a P-type MOSFET T12 and the resistor R5. The source of the FET T12 is connected to the plus-side output terminal of the battery E, and the drain thereof is connected to one end of the resistor R5. The other end of the resistor R5 is connected to the gate of the FET T11. Further, the gate of the FET T12 is connected to the drain of the FET Td4.

Next, an operation of the third embodiment that has the above-described structure will be described. If the level of the input signal voltage Vi is inverted from an H level to an L level, the filter circuit 13 is initially reset to an L level. Therefore, the output signal of the OR circuit OR11 becomes an L level, and the FET Td4 is turned off. Therefore, the FET Td3 and the transistor Td2 are turned on, and the gate of the FET T11 is connected to a ground through the gate resistor Rg. As a result, the FET T11 is turned on.

If the resistance Ra between the gate and the drain of the FET T11 represents the leak resistance, the leak resistance Ra is infinite in a normal state. However, if the destruction of the insulating layer occurs between the gate and the drain of the FET T11, the leak resistance Ra becomes a finite value, the leak current Ig flows through a path of the drain of the FET T11→the gate of the FET T11 via Ra→the gate resistor Rg→the transistor Td2→the ground, and the voltage drop occurs in the gate resistor Rg.

In this case, in a state where the resistance of the ON failure determining circuit 21 is set to R1=R2 and the reference voltage is set to VA=3 V, if the leak current Ig increases and the Rg*Ig exceeds 6 V, the output of the comparator CMP11 becomes an H level. If this state is maintained for a predetermined time, the output of the OR circuit OR11 becomes an H level. As a result, the FET Td4 is turned on, the FET Td3 and the transistor Td2 are turned off, and the transistor Td1 is turned on. The voltage of the gate of the FET T11 is increased to the voltage VB of the battery E through the gate resistance Rg. Further, since the gate of the FET T12 is connected to a ground when the FET Td4 is turned on, the FET T12 is turned on, and the gate of the FET T11 is connected to the power supply VB through the resistor R5 having the low resistance. Therefore, even though Rg*Ig is greater than 6 V, it is possible to surely intercept the FET T11.

In this way, in the ON failure detecting apparatus of the power supply circuit according to the third embodiment of the invention, even when the P-type MOSFET T11 is used as a semiconductor element for switching the driving and the stopping of the load, similar to the above-described second embodiment, in a case where the destruction of the insulating layer occurs between the gate and the drain of the FET T11 and thus the leak current flows, occurrence of the insulating layer destruction can be detected in advance by detecting the voltage drop occurring in the gate resistor Rg. Therefore, it is possible to surely intercept the FET T11.

Until now, the ON failure detecting apparatus of the power supply circuit according to the preferred embodiments of the invention has been described with reference to the accompanying drawings, but the invention is not limited thereto. The structure of each member can be replaced by any structure having the same function.

For example, in the above-described embodiments, an example has been described in which a battery is mounted in the vehicle as the power supply, and a lamp and a motor are mounted in the vehicle as the load. However, the invention is not limited thereto, and it may be applied to other power supply circuits.

Further, in the above-described embodiments, the N-type or P-type MOSFET has been used as a switching semiconductor element, but the invention is not limited thereto. A junction transistor or an IGBT (insulating gate bipolar transistor) may be used.

Since an indication that the ON failure occurs in the switching semiconductor element can be detected, the semiconductor element can be intercepted such that the intercepting function is not damaged, and the circuit can be effectively protected.

What is claimed is:

1. An ON failure detecting apparatus for a power supply circuit that detects an ON failure in a semiconductor element of the power supply circuit, the power supply circuit including the semiconductor element disposed between a power supply and a load, and controlling driving and stopping of the load by switching ON and OFF of the semiconductor element, comprising:
a driving circuit that supplies a driving signal for switching ON and OFF of the semiconductor element to a driving terminal of the semiconductor element;
a first resistor that are provided between the driving circuit and the driving terminal; and
an ON failure determining unit that detects whether a voltage generated in the first resistor exceeds a predetermined value, and determines that an ON failure occurs in the semiconductor element, when the voltage exceeds the predetermined value.

2. The ON failure detecting apparatus according to claim 1 wherein the ON failure detecting unit includes a comparing unit that compares a first voltage obtained by a voltage at one end of the first resistor and a second voltage obtained by a voltage at the other end of the first resistor, and detects whether a voltage generated in the first resistor exceeds a predetermined value on the basis of the result obtained by the comparing unit.

3. The ON failure detecting apparatus according to claim 1, wherein the semiconductor element is composed of an N-type MOSFET;
the power supply circuit is constructed such that a drain of the N-type MOSFET is connected to the power supply, and a source thereof is connected to the load;
the driving circuit outputs a driving signal on the basis of a power supply voltage; and
the ON failure determining unit detects whether a voltage between a gate voltage (VG) of the N-type MOSFET and the power supply voltage (VB) is less than a predetermined value (δ) that is smaller than a voltage difference (Vcp) between the an output voltage (VD) of the driving circuit and the power supply voltage (VB).

4. The ON failure detecting apparatus according to claim 1, wherein the semiconductor element is composed of an N-type MOSFET, and
the ON failure determining unit includes a grounding unit that stops, when it is determined that an ON failure occurs in the semiconductor element, the supply of a driving signal by the driving circuit, and connects a gate of the N-type MOSFET to a ground through a second resistor having a smaller resistance than the that of the first resistor.

5. The ON failure detecting apparatus according to claim 1, wherein the semiconductor element is composed of a P-type MOSFET, and
    the ON failure determining unit includes a shutting down unit that stops, when it is determined that an ON failure occurs in the semiconductor element, the supply of a driving signal by the driving circuit, and connects a gate of the P-type MOSFET to the power supply through a third resistor having a smaller resistance than the first resistor.

* * * * *